(12) United States Patent
Mizutani et al.

(10) Patent No.: US 7,280,578 B2
(45) Date of Patent: Oct. 9, 2007

(54) NEAR-FIELD LIGHT SOURCE DEVICE, AND OPTICAL HEAD, OPTICAL DEVICE, EXPOSURE APPARATUS AND MICROSCOPE DEVICE HAVING SUCH A NEAR-FIELD LIGHT SOURCE DEVICE

(75) Inventors: Natsuhiko Mizutani, Tokyo (JP); Tomohiro Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 10/937,387

(22) Filed: Sep. 10, 2004

(65) Prior Publication Data

US 2005/0063445 A1    Mar. 24, 2005

(30) Foreign Application Priority Data

Sep. 12, 2003    (JP)    ............... 2003-320925

(51) Int. Cl.
*H01S 3/83*    (2006.01)
(52) U.S. Cl. ............ 372/94; 369/13.33; 372/102; 372/49.01
(58) Field of Classification Search ............. 372/49.01, 372/94, 102; 369/13.33
See application file for complete search history.

(56) References Cited

U.S. PATENT DOCUMENTS

| 3,691,477 | A | * | 9/1972 | Janney ............... 372/94 |
| 3,824,487 | A | * | 7/1974 | Buczek et al. ............... 372/95 |
| 6,088,378 | A | * | 7/2000 | Furukawa ............... 372/92 |
| 6,167,016 | A | * | 12/2000 | Block et al. ............ 369/13.13 |
| 6,236,033 | B1 | | 5/2001 | Ebbesen et al. ............ 250/216 |
| 6,552,966 | B1 | * | 4/2003 | Hasegawa et al. ....... 369/13.13 |
| 6,982,844 | B2 | * | 1/2006 | Rettner et al. ............... 360/59 |
| 2003/0211403 | A1 | | 11/2003 | Mizutani et al. ............... 430/5 |
| 2004/0121245 | A1 | | 6/2004 | Inao et al. ............... 430/5 |

FOREIGN PATENT DOCUMENTS

JP    2001-326420    11/2001

* cited by examiner

*Primary Examiner*—Minsun Oh Harvey
*Assistant Examiner*—Tod T. Van Roy
(74) *Attorney, Agent, or Firm*—Fitzpatrick, Cella, Harper & Scinto

(57) ABSTRACT

A near-field light source device including a semiconductor laser comprised of laminated semiconductor layers and having a ring-type optical resonator with a plurality of wave guides connected via mirror portions, a light blocking film formed in one of the mirror portions and having a small opening not greater than a wavelength size, and a diffraction grating formed on the light blocking film. The light oscillated from the semiconductor laser is diffracted by the diffraction grating, the diffracted light is coupled to a rotation mode in the ring-type optical resonator, and near-field light is generated via the small opening.

9 Claims, 7 Drawing Sheets

B - B' SECTION

A - A' SECTION

NEAR-FIELD LIGHT SOURCE DEVICE, AND OPTICAL HEAD, OPTICAL DEVICE, EXPOSURE APPARATUS AND MICROSCOPE DEVICE HAVING SUCH A NEAR-FIELD LIGHT SOURCE DEVICE

FIELD OF THE INVENTION AND RELATED ART

This invention relates to a near-field optical device. More particularly, the invention concerns a near-field light source device using a ring resonator type semiconductor laser, and an optical head, an optical device, an exposure apparatus and a microscope device having such a near-field optical device.

In recent years, developments are being furthered in the fields of high-resolution observation technology, next-generation high-density recording technology and super-fine exposure technology, for example, on the basis of optical technology using evanescent light that leaks from a small opening on an order of 100 nm or less, formed at a free end of a sharp probe, i.e., using what is called a near-field optical system.

As a near-field light source to be used in high-density recording such as described above, Japanese Laid-Open Patent Application, Publication No. 2001-326420, discloses a ring resonator type semiconductor laser having a ring-shaped optical resonator in which laser oscillation is generated on the basis of reflection at plural interfaces, wherein a small opening is formed at a position on one of the plural interfaces, where the laser light produced by the laser oscillation is reflected.

Also, U.S. Pat. No. 6,236,033 discloses a near-field light reinforcing technology wherein a periodically varying surface shape is defined nearby a small opening, wherein light incident on one surface of a metal film interacts with a surface plasmon mode on at least one surface of the metal film and, as a result, light transmission through at least one opening of the metal film is strengthened.

However, in order to meet the strict requirements of recent next-generation high-density recording technology or super-fine exposure technology, as described above, the near-field light source based on a ring resonator type semiconductor laser, as disclosed in Japanese Laid-Open Patent Application, Publication No. 2001-326420, mentioned above, is not fully satisfactory with respect to the stability of the light intensity, for example. Further, simply reinforcing the light, as disclosed in U.S. Pat. No. 6,236,033, mentioned above, is still insufficient.

SUMMARY OF THE INVENTION

It is accordingly an object of the present invention to provide a near-field light source device of a low threshold value, good efficiency and stable oscillation mode, whereby near-field light having less variation of light intensity and having an increased intensity can be produced.

It is another object of the present invention to provide an optical head, an optical device, an exposure apparatus or a microscope device, having such a near-field light source device.

In accordance with the present invention, a near-field light source device, an optical head, an optical device, an exposure apparatus and/or a microscope device, having such a near-field light device, such as described below, can be provided.

Specifically, in accordance with an aspect of the present invention, there is provided a near-field light source device, comprising a semiconductor laser having a ring-type optical resonator with a plurality of wave guides connected via mirror portions, a light blocking film formed in one of the mirror portions and having a small opening not greater than a wavelength size, and a diffraction grating formed on the light blocking film, wherein light oscillation from the semiconductor laser is diffracted by the diffraction grating, and the diffracted light is coupled to a rotation mode in the ring-type optical resonator. The ring-type optical resonator may comprise a combination of straight wave guides. As regards higher order diffraction light, diffraction light on an order other than zero-th order or, alternatively, diffraction light of not lower than a positive first (+1st) order or diffraction light of not higher than a negative first (−1st) order, may be coupled to the rotation (circulation) mode in the ring-type optical resonator.

In a near-field light source device in one preferred form of this aspect of the present invention, the small opening may be a slit-like opening being elongated in a direction along a groove of a diffraction grating.

In one preferred form, the rotating direction in the ring-type optical resonator may have two different and independent rotation modes, wherein coupling of these rotation modes may be a strong coupling.

In the two rotation modes, higher-order diffraction light may be coupled to a rotation mode of the same direction or an opposite direction.

In one preferred form, higher order diffraction light produced by the diffraction grating may excite surface plasma polariton upon the light blocking film to reinforce the intensity of near-field light in the vicinity of the small opening. The electrical field vector of laser light produced by the semiconductor laser may extend along a surface direction of a lamination structure and includes a component perpendicular to an interface, at the diffraction grating.

In one preferred form, the near-field light source device may have a reflection surface by which, with respect to one of two independent rotating directions in the ring-type optical resonator, light is reflected to be coupled to the mode of the other rotating direction.

In one preferred form of near-field light source device, at least a substrate portion being outside a plane defined by extending a corner mirror on which the aforementioned light blocking film is formed (i.e., at a side remote from the ring resonator type semiconductor laser), may be removed.

In accordance with another aspect of the present invention, there is provided a floating type optical head, comprising a near-field light source device as discussed above, and means for floating the near-field light source device at a surface of a recording medium so that at least one of recording, reproducing and erasing, or all of them, are carried out on the basis of light produced in the vicinity of the opening.

In one preferred form of a floating type optical head in this aspect of the present invention, the structure may include a slider on which the near-field light source device is mounted, and the slider may be arranged to float on the recording medium surface.

In one preferred form of a floating type optical head, a reproducing signal may be obtained on the basis of a change in voltage between terminals of the semiconductor laser.

In one preferred form of a floating type optical head, a reproducing signal may be obtained from a light receiving element disposed adjacent to the semiconductor laser.

In accordance with a further aspect of the present invention, there is provided an optical device, comprising a near-field light source device as discussed above, and means for performing at least one of recording, reproducing and erasing, or all of them, by use of the near-field light source device.

In accordance with a still further aspect of the present invention, there is provided an exposure apparatus, comprising a near-field light source device as discussed above, and a wafer stage, wherein the near-field light source device is disposed close to the wafer stage, and exposure is carried out on the basis of light produced in the vicinity of the opening. The exposure apparatus may have a cantilever for supporting the near-field light source device.

In accordance with a yet further aspect of the present invention, there is provided a microscope, comprising a near-field light source device as discussed above, and a sample table, wherein the near-field light source device is disposed close to the sample table, and observation of a sample is carried out on the basis of light produced in the vicinity of the opening and projected to the sample. The microscope may have a cantilever for supporting the near-field light source device.

In accordance with the present invention, therefore, a near-field light source device of a low threshold value, good efficiency and stable oscillation mode, whereby near-field light of less variation of light intensity and having an increased intensity can be produced, is accomplished. Also, an optical head, an optical device, an exposure apparatus or a microscope device, having such a near-field light source device can be accomplished. Furthermore, a near-field light source device small in size and power consumption, and being able to produce near-field light efficiently, and, thus, being suited to be mounted on an optical head, can be accomplished.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Briefly, in an aspect of the present invention, light being oscillation with a laser mode is diffracted by a diffraction grating formed on a light blocking film, which is provided on a corner mirror portion of a ring-type optical resonator, and higher order diffraction light from the diffraction grating is coupled to a rotation (circulation) mode, by which a stable oscillation mode is assured and by which near-field light, whose light intensity varies less and whose intensity is much increased, is accomplished. The present invention, as such, is made on the basis of the following findings, first found by the inventors of the subject application. This will be explained below, in detail.

Figure 1A:
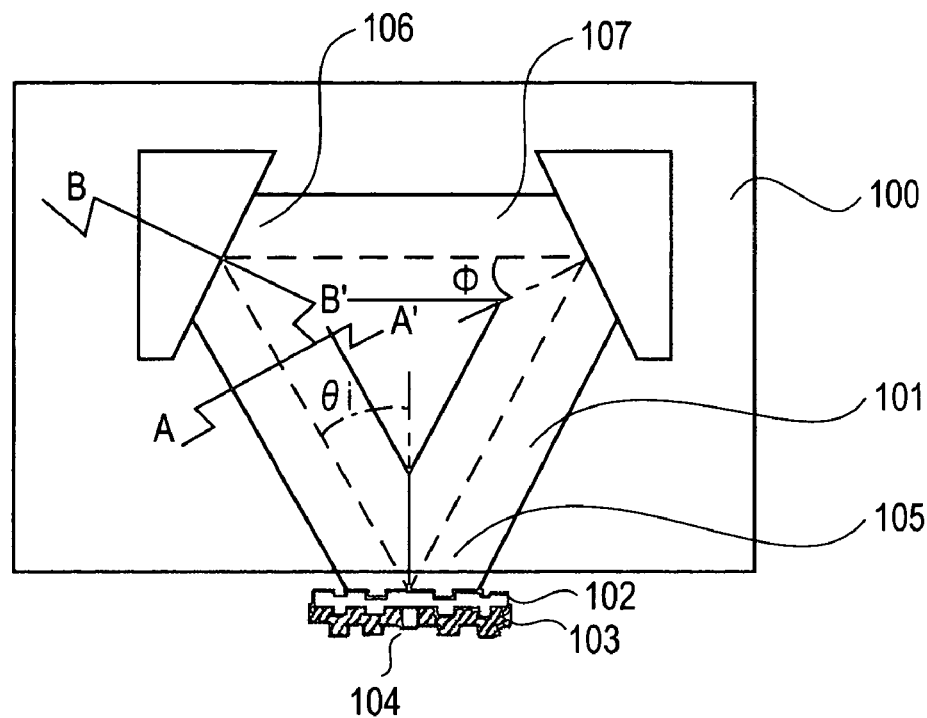
FIGS. 1A-1C illustrate the structure of a near-field light source device according to a first embodiment of the present invention.
Figure 1B:
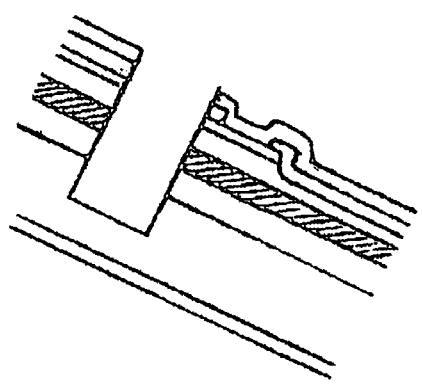
Figure 1C:
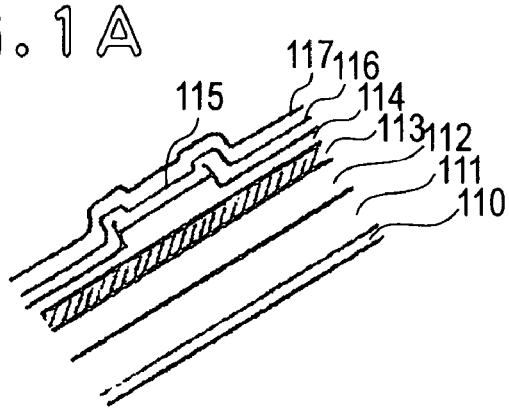

FIGS. 1A-1C show the structure of a near-field light source according to an embodiment of the present invention.

In FIG. 1A, denoted at 100 is a near-field light source device, and denoted at 101 is a ring resonator type semiconductor laser. The ring resonator type semiconductor laser 101 comprises straight wave guides and corner mirrors 105, 106 and 107.

In this example, the corner mirror 105 is provided by a corner mirror having a diffraction grating. More specifically, in order to obtain a structure that a light blocking film has a diffraction grating formed thereon, a multilayered film comprising a dielectric film 102 and a metal film 103, having periodic surface irregularity, as shown in FIG. 1A, is formed to provide a light blocking film. Denoted at 104 is a small opening formed in the metal film 103.

First of all, a ring resonator type semiconductor laser will be explained briefly.

The optical resonator of the ring resonator type semiconductor laser has a triangular shape defined by a plurality of straight light wave guides and corner mirrors for connecting them. In the case of a triangular ring resonator, such as shown in the drawing, the total reflection critical angle at the semiconductor/air interface is seventeen degrees, with respect to effective refraction 3.3 of the wave guide mode. Since the incidence angle upon the corner mirror is larger than the total reflection critical angle, at each corner mirror portion, the laser light is totally reflected. Since the light to be emitted outwardly of the resonator is small and, thus, the loss is small, a semiconductor laser having a low threshold value can be accomplished.

The resonance mode of a ring resonator with respect to light having a certain oscillation frequency includes two modes, that is, a clockwise rotation mode and a counterclockwise rotation mode.

When backscattering at a wave guide or corner mirror is small, these two modes are coupled by weak coupling. In the case of weak coupling, the clockwise rotation mode and the counterclockwise rotation mode can exist independently from each other. Then, at the corner mirror having a small opening, a standing wave is produced by lights of the two modes. When two modes are independent and weakly coupled, the position of the loop of this standing wave is easily changeable which, in turn, leads to a possibility of a variation in near-field intensity.

Figure 6:
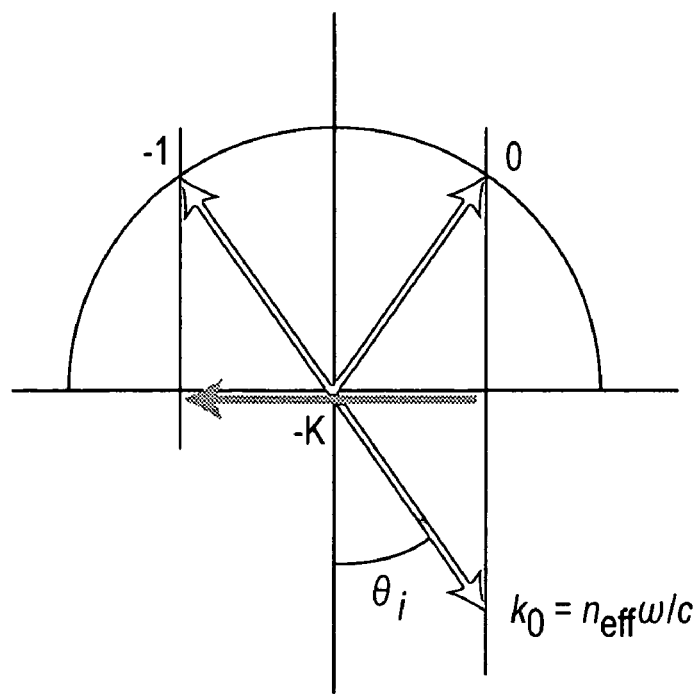
FIG. 6 is a schematic view for explaining a wave number vector of higher order diffraction light of a diffraction grating, in an embodiment of the present invention.

If the corner mirror is formed with periodic surface irregularity, this surface irregularity may function as a diffraction grating. If the period of the irregularity is designed as follows to be coordinated with the laser oscillation frequency, then negative first (−1st) order diffraction light of the diffraction grating returns to its oncoming wave guide in an opposite direction. See FIG. 6, wherein $K=2\pi/\Lambda$ is a wafer number vector of the diffraction grating.

$$neff\frac{\omega}{c}\sin\theta i \frac{2\pi}{\Lambda} = -neff\frac{\omega}{c}\sin\theta i \qquad (1)$$

where $\omega$ is an oscillation angle frequency of the laser, neff is an effective refractive index of a slab wave guide, c is the light velocity in a vacuum, $\Lambda$ is the pitch of the irregularity, and $\theta i$ is the incidence angle upon the corner mirror. In this equation and equations to be mentioned below, the wave number neff$\omega$/c sin $\theta i$ of the incident wave parallel to the diffraction grating always takes a positive value ($0 \leq \theta i \leq \pi/2$). Forward diffraction with this value becoming larger is called positive first (+1st) order diffraction, positive second (+2nd) order diffraction, and so on, while backward diffraction with this value becoming smaller is called negative first (−1st) order diffraction, negative second (−2nd) order diffraction, and so on. In equation (1) above, since a coefficient −1 is applied to the wafer number vector $2\pi/\Lambda$ of the diffraction grating, it is negative first (−1st) order diffraction.

With such a corner mirror, backscattering becomes large, and the clockwise rotation mode and the counterclockwise rotation mode are bonded by strong coupling. In such a case, once laser oscillation starts within the semiconductor laser, one of the clockwise rotation mode and the counterclockwise rotation mode dominates, such that modulation of the standing wave becomes shallow. Thus, it becomes possible to reduce the phenomenon of variation in the near-field intensity due to a change in the oscillation mode inside the ring resonator type semiconductor laser. Also, comparing light of such a wavelength that negative first (−1st) order diffraction light returns to its oncoming wave guide with light having a slightly different wavelength, avoidance of emission of higher order modes outside the resonator has assured that the loss of the former mode becomes relatively small, such that the laser oscillation with this wavelength is made easier. This is an additional factor being advantageous to stabilized operation of the near-field light source.

A portion of the metal film 103 on the corner mirror is removed, and a small opening 104 is formed thereby. Although the shape of the opening may be circular, having high symmetry, if it is a slit-like shape being elongated along the magnetic field direction of the laser light mode, a near field can be efficiently produced in the vicinity of the small opening.

Furthermore, the structure may be arranged so that negative second order diffraction light and first order diffraction light function to excite surface plasmon upon the metal surface of the corner mirror.

Figure 7:
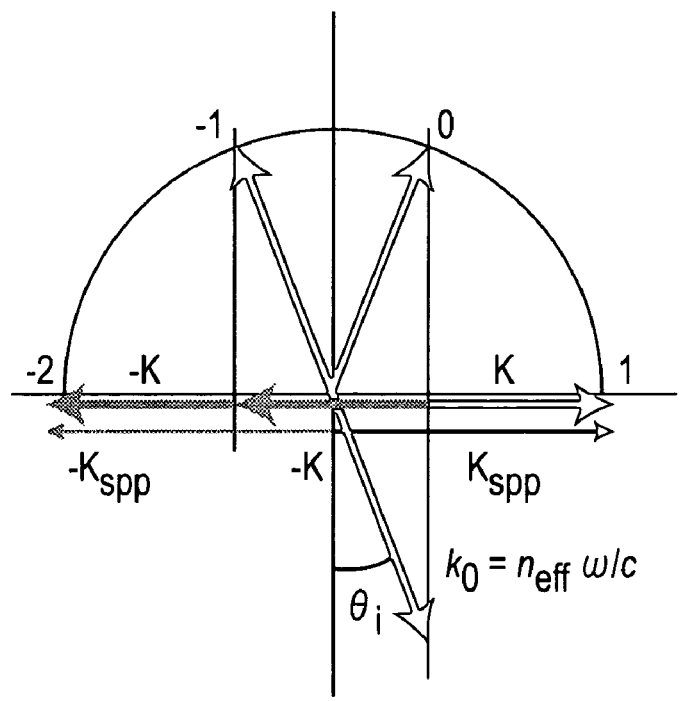
FIG. 7 is a schematic view for explaining a wave number vector of higher order diffraction light of a diffraction grating, in an embodiment of the present invention.

This is the case wherein the following equation (2-1) (first order diffraction light excites surface plasmon) and equation (2-2) (negative second order diffraction light excites surface plasmon) are almost satisfied. Since, however, the Q-value of the surface plamson resonance is not large, surface plasmon can be excited, provided that conditions approximately satisfying these equations are realized. See FIG. 7.

$$neff\frac{\omega}{c}\sin\theta i + \frac{2\pi}{\Lambda} = Kspp \qquad (2\text{-}1)$$

$$neff\frac{\omega}{c}\sin\theta i - \frac{2\pi}{\Lambda} \times 2 = Kspp \qquad (2\text{-}2)$$

wherein Kspp is the wave number vector of the metal surface plasmon polariton of the angular frequency $\omega$.

If the values of Kspp and $\Lambda$ satisfy equation (1) and equation (2-1), equation (2-2) is automatically satisfied. Alternatively, if the values of Kspp and $\Lambda$ satisfy equation (1) and equation (2-2), equation (2-1) applies simultaneously.

However, for coupling with the surface plasmon polariton, there is a condition that the polarization of incident light has an electrical field vector extending along the surface direction of the lamination structure of the semiconductor laser and that, upon the diffraction grating, it has a component perpendicular to the interface. If a distortion-free or compressed quantum well activating layer is used as the semiconductor laser, such a polarization mode will provide a larger gain and a lower threshold value. If an extension distortion quantum well activating layer is used as the quantum well activating layer, there will be cases wherein a large gain is obtainable with this polarization and a case wherein a large gain is obtainable with polarization perpendicular to it, whichever is determined in dependence upon the parameter of the quantum well.

In the manner described above, surface plasmon polariton can be excited by the diffraction grating, and the near field intensity in the vicinity of the small opening can be strengthened. Also, as described hereinbefore, in the strong coupling state, the laser mode in the resonator is either mainly clockwise or counterclockwise, and modulation due to the standing wave in the vicinity of the diffraction grating becomes shallow. Then, in the surface plasmon excited at the diffracting grating surface, the component to be propagated in a particular direction (clockwise or counterclockwise) becomes dominant. As a result of this, the influence due to the positional relationship between the diffracting grating and the small opening becomes weak. By transportation of energies from the upstream side with respect to the plasmon propagation, the near-field intensity is strengthened.

As an alternative embodiment of a near-field light source based on such a ring resonator type semiconductor laser, there may be an example wherein, in each of a clockwise rotation mode and a counterclockwise rotation mode, negative first (−1st) order diffraction light of a diffraction grating on a corner mirror functions so that light incident from a first straight wave guide is joined to a second straight wave guide. In such an example, since the propagation direction of the diffraction light has an angular dispersion, the state of coupling described above can be accomplished with a particular wavelength. Namely, a semiconductor laser of a single longitudinal mode operation is provided and, thus, a near-field light source having good linearity with respect to electrical current versus near-field intensity is accomplished.

In this case, with respect to zero-th order diffraction light of one of the rotation modes, a reflection surface for bending it back may be provided separately and, on that occasion, coupling can be attained between the two rotation modes and a strong coupling state can be accomplished. As a result, as with the preceding example, once laser oscillation starts inside the semiconductor laser, one of the clockwise rotation mode and the counterclockwise rotation mode becomes dominant, such that the phenomenon of variation of near-field intensity due to a change in oscillation mode in a ring resonator type semiconductor laser can be avoided.

As a further alternative embodiment of a near-field light source based on a ring resonator type semiconductor laser, the structure may be arranged so that, in each of the clockwise rotation mode and the counterclockwise rotation mode, negative first (−1st) order diffraction light of a diffraction grating at a corner mirror excites surface plasmon polariton to thereby increase the near-field intensity around the small opening.

Here, since the propagation direction of diffraction light has an angular dispersion, also in this case, there is such a wavelength dependency that the above-described state of coupling is accomplished by a particular wavelength and the loss becomes largest, whereas the loss is reduced as the wavelength shifts from it. Namely, such a diffraction grating is able to provide a difference of loss between the longitudinal modes of the resonator and to reduce the mode competition between the longitudinal modes. Consequently, a semiconductor laser of a stable single mode operation is provided and, thus, a near-field light source having good linearity with respect to electrical current versus near-field intensity and having reduced noise is accomplished.

Next, the present invention will be described specifically with reference to preferred embodiments thereof.

Embodiment 1

A first embodiment of the present invention will be described with reference to an example of a near-field light source device shown in FIGS. 1A, 1B and 1C. Details of the structure of the near-field light source device 100 shown in FIGS. 1A-1C are as have been described hereinbefore.

In this embodiment, the near-field light source device 100 was manufactured in the following manner.

First, a semiconductor multilayer structure, such as shown in the section view of FIG. 1C taken along a line A-A', was formed in accordance with a vapor-phase epitaxy method. More specifically, an n-AlGaAs clad layer 112, an AlGaAs/AlGaAs quantum well activating layer 112, a p-AlGaAs clad layer 114 and a p-GaAs cap layer 115 were formed on an n-GaAs substrate 111 in accordance with crystal growth. A photoresist was applied and, through mask pattern exposure and development, a resist pattern of a ring resonator shape was formed. By means of reactive ion etching using a chlorine gas, a part of the p-clad layer 114 was removed and a ring-like ridge wave guide was formed. As an example, the residual thickness of the p-clad layer was set to be 0.1 μm. Subsequently, a mask pattern as a corner mirror portion was formed again and, by etching it to a depth deeper than the activating layer by about 1 μm, a corner mirror, such as shown in the section view of FIG. 1B, taken along a line B-B', was produced. In this example, at the corner mirror 105, a periodic surface irregularity pattern (protrusion and recess) was formed in the corner mirror, so that it might function as a backing (substrate) for a surface irregularity to be defined thereon later as a diffraction grating. Since the wave-guiding mode extends wider than the ridge width, the width of the corner mirror is made larger than the width of the ridge wave guide.

A film of SiNx was formed as a dielectric material film at 116 and 102, and a contact window was formed only at the ridge upper portion. The thickness of the dielectric material film 102 on the corner mirror surface was 100 nm. A p-electrode 117 was formed by vapor deposition of Cr/Au.

At that time, in order to prevent deposition on the dielectric material on the mirror surface, an oblique deposition method was used. Subsequently, by using Ag sputtering, a light blocking film 103 for the corner mirror 105 was formed on the dielectric material film. At the bottom side of the wafer, AuGe/Ni/Au was vapor deposited, and an n-electrode 110 was formed. Then, it was alloyed in a hydrogen ambience, and ohmic contact was formed at the interface between the p- and n-electrodes and the semiconductor. At the corner mirror position, the wafer was cleaved. By means of FIB processing, a part of the metal film 103 on the corner mirror was removed, whereby a small opening 104 was formed.

When the p-electrode 117 and n-electrode 110 were connected to a laser driving driver, and the laser was driven with a constant electrical current above the oscillation threshold current, the ring resonator type semiconductor laser 101 produced laser oscillation. If the device structure is such that the whole surface is covered by a metal electrode, as in this embodiment, the laser oscillation threshold value can be identified as a kink of an I-dV/dI curve obtainable by plotting differential resistance dV/dI of the device and the electrical current could be measured as a bend of an I-L curve obtainable by plotting the electrical current I and the optical output L. Since, however, the optical output there is based on scattered light from a total reflection mirror, as compared with an optical output of an ordinary end-face emission laser, it is very weak, such as about 1/1000.

The polarization mode of the laser there was what is called a TE mode, in which the electrical field extends along the surface direction of the lamination of the laser.

As regards the size of the small opening, for an example, the opening had an elongated slit-like shape having a width of 50 nm and a length of 50 nm, the lengthwise direction of the slit being placed parallel to the ridge of the diffraction grating.

Next, an example of a parameter for a ring laser with a diffraction grating will be explained.

For a slab wave guide having an effective refractive index 3.3, a laser oscillation with a wavelength of 0.85 μm and an incidence angle 20 deg., from equation (1) mentioned above, it is seen that the pitch Λ of the diffraction grating may be set to be 386 nm. Even if the incidence angle θi is different, the pitch Λ can be set in accordance with equation (1) mentioned above.

Subsequently, the condition for the negative second (−2nd) order diffraction light to excite surface plasmon can be determined by using a wave number Kspp of the surface plasmon with respect to a wavelength of 0.85 μm in a vacuum, and on the basis of equations (1) and (2-2) mentioned above, in the manner defined by equation (3) below.

$$\sin\theta i = \frac{1}{3} Kspp \Big/ \Big(neff\frac{\omega}{c}\Big) \gtrsim \frac{1}{3} \quad (3)$$

In this equation, the latest inequality sign is the result of that, when the angular frequency ω of the laser light is smaller than the angular frequency of the plasma vibration, Kspp>~neff(ω/c) is used. It is seen that this condition is satisfied approximately in the vicinity of sin θi~(nearly equal) ⅓. In fact, in the ring resonator shown in FIG. 1, sin 20(deg.)=0.342 and, actually, it is near this condition.

However, if it exactly applies to the condition for the negative second order diffraction light and first order diffraction light to excite the surface plasmon, the efficiency of negative first order diffraction contributable to the resonator mode will decrease, and the threshold level of the semiconductor laser will increase. In consideration of this, when a resonator and a diffraction grating, such as described hereinbefore are designed, the gain peak wavelength of the activating layer may be shifted toward the longer wavelength side. By doing so, laser oscillation is obtainable with such a wavelength whereat the efficiency of negative first order diffraction rises, and thus, a near-field light source that provides a low threshold level and an intense near-field strength can be accomplished.

Figure 3:
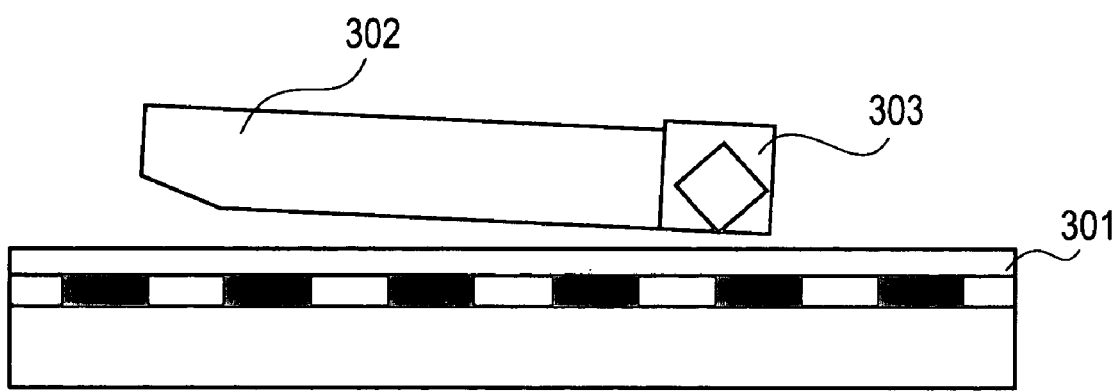
FIG. 3 is a schematic view of the structure of an example of a recording/reproducing floating type optical pickup, having a near-field light source device according to the first embodiment of the present invention.

FIG. 3 shows a structural example of a floating type recording/reproducing optical pickup that uses a near-field light source device of FIG. 1, arranged in accordance with this embodiment of the present invention.

Denoted at 301 is an optical disc, such as a photomagnetic disc or a micro pit or a phase change recording, for example. Denoted at 302 is a slider, which is floating, while being held by an arm (not shown), from the disc 301, by a predetermined clearance. Here, the predetermined clearance is approximately not greater than the size of the opening of the near-field light source. By an actuator (not shown), the slider is moved reciprocally within a predetermined range along the optical disc 301. Mounted on the slider 302 is a near-field light source device 303. As a ring resonator type semiconductor laser of the near-field light source provides laser oscillation, a small light spot is formed on the optical disc.

In order that a change in reflection characteristic of the optical disc is ready by means of this light source, the quantity of returning light to be re-coupled to the optical resonator through the small opening is changed. In the case of a photo-magnetic disc, the quantity of light coupled to the laser mode varies with rotation of the polarization plane of the returning light. Such a change in the returning light quantity can be detected in accordance with the principle known as self-coupling type optical pickup (SCOOP). Namely, if the returning light is coupled to the optical resonator, the light intensity inside the semiconductor laser changes. Such a change is thus detected. Changes of the light intensity can be detected by using a separate light receiving element, which may be provided in the vicinity of the corner mirror, or it can be detected on the basis of changes in electrical voltage between terminals of the semiconductor laser.

Embodiment 2

Figure 2:
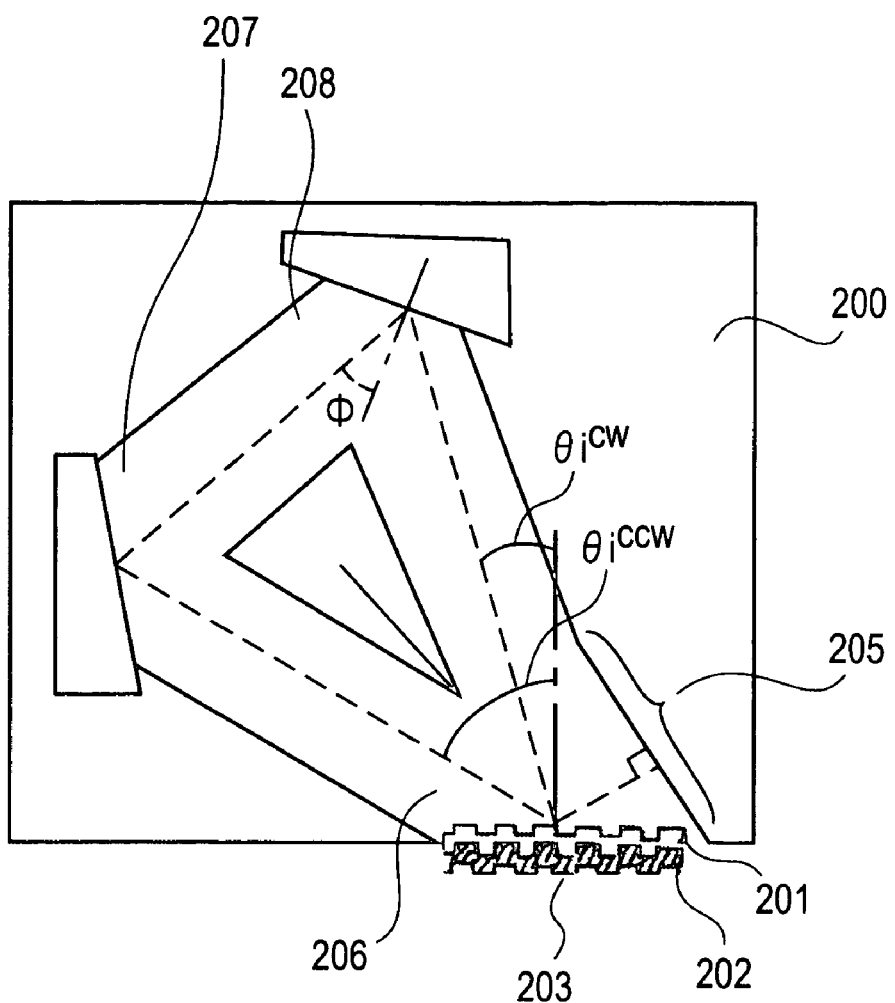
FIG. 2 is a schematic view of the structure of a near-field light source device according to a second embodiment of the present invention.

FIG. 2 shows the structure of a near-field light source device according to a second embodiment of the present invention. In this embodiment, each of the clockwise rotation mode and the counterclockwise rotation mode is accomplished by negative first order light from a diffraction grating.

In FIG. 2, denoted at 200 is a near-field light source device of the present invention. A light blocking film on a mirror comprises a dielectric material film 201 and a metal film 202, and it is formed with periodic surface irregularity so that it can function as a diffraction grating. A small opening 203 is formed in this metal film. Denoted at 205 is a reflection surface to be described later in detail.

Denoted at 206 is a corner mirror having a diffraction grating, and denoted at 207 and 208 are plane corner mirrors that constitute a ring resonator.

The layer structure as a semiconductor laser and the method of producing the same are similar to those in the first embodiment.

The second embodiment largely differs from the first embodiment in the point of corner mirror 206 with a diffraction grating.

First, the counterclockwise rotation mode will be explained as an example.

In the counterclockwise mode, light is incident with an incidence angle θiccw. When negative first order diffraction light at the diffraction grating is emitted with an emission angle θicw, it is coupled to the straight wave guide and is propagated toward the corner mirror 208.

On the other hand, in the clockwise rotation mode, light is incident with an incidence angle θicw and, as negative first order diffraction light at the diffraction grating is emitted with an emission angle θiccw, it is coupled to the straight wave guide and is propagated toward the corner mirror 208.

Since the emission angle of higher order diffraction light, except zero-th order, depends on the angular frequency of light (wavelength in vacuum), as described hereinbefore, this ring resonator is now a resonator small loss at a particular angular frequency (wavelength in a vacuum), such as that two straight wave guides are coupled to each other with respect to negative first order diffraction light, the loss being large with respect to any other wavelength.

Namely, in the structure such as described above, the wavelength selectivity is high as compared with the semiconductor ring laser of the first embodiment.

Figure 8:
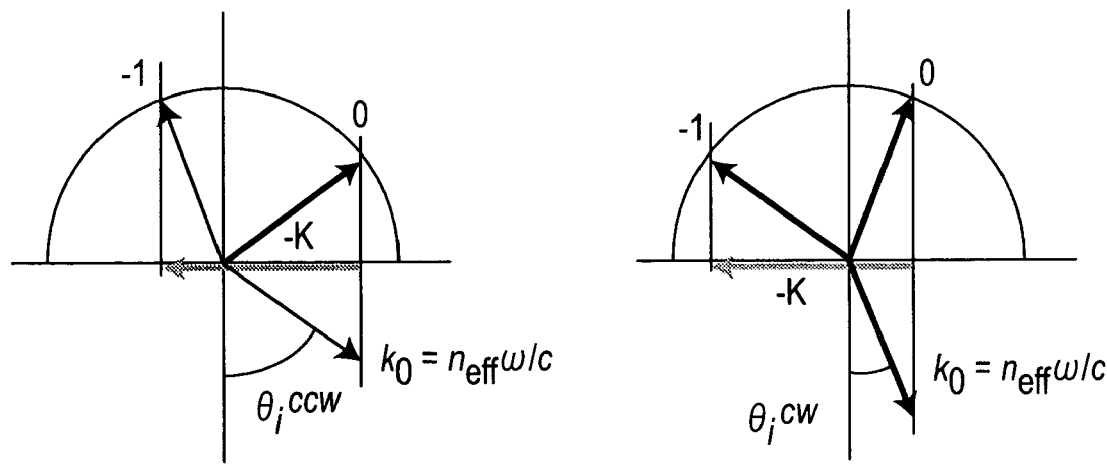
FIG. 8 is a schematic view for explaining a wave number vector of higher order diffraction light of a diffraction grating, in the second embodiment of the present invention.

This condition is expressed by equations (4) below. Since these two equations are equivalent, substantially a single equation is defined thereby. See FIG. 8.

$$neff\frac{\omega}{c}\sin\theta i^{cw} - \frac{2\pi}{\Lambda} = -neff\frac{\omega}{c}\sin\theta i^{cw} \brace neff\frac{\omega}{c}\sin\theta i^{ccw} - \frac{2\pi}{\Lambda} = -neff\frac{\omega}{c}\sin\theta i^{cw}} \quad (4)$$

This is due to the symmetry of coupling at the diffraction grating. Namely, if negative first order diffraction light in a clockwise rotation mode with respect to a certain wavelength of light couples two wave guides to each other, also, in a counterclockwise mode, the light of the same wavelength does couple the two wave guides on the basis of the negative first order diffraction light. Further, it is known that the coupling efficiency in two cases of negative first order diffraction, interchanging the incidence angle and the emission angle as described hereinbefore, takes the same value.

Considering the wavelength selectivity in greater detail, the wavelength selectivity of the resonator is prescribed by both of (i) the characteristics of the resonator longitudinal mode determined by the rotational distance of the resonator (i.e., characteristics of wavelengths such as N−1 wavelengths, N wavelength, N+1 wavelength, and so on, when the rotation distance of the resonator is counted in terms of wavelength inside medium) and (ii) the wavelength dispersion characteristics of the diffraction grating mirror for coupling between two straight wave guides through negative first order (or order higher than it) diffraction light. In order to obtain the total resonator loss, the product of the loss of the rotation mode as dominated by the longitudinal mode and the loss of a diffraction grating mirror may be considered.

The laser oscillation of a ring resonator type semiconductor laser having a structure such as described above is, because of the wavelength selectivity of the resonator, a single longitudinal mode oscillation. In the semiconductor laser having been described with reference to the first embodiment, the wavelength selectivity between the resonator longitudinal modes is small (the difference in rotational loss between the longitudinal modes is small) and, therefore, as the injection electrical current is enlarged from the laser oscillation threshold level, longitudinal multiple mode oscillation is initiated in the vicinity of the gain peak. In this embodiment, on the other hand, since the single longitudinal mode oscillation under the condition determined by the diffraction grating is held, mode competition noise or mode hopping noise in the optical output, for example, can be well avoided and, thus, a stable near-field light source is accomplished.

Furthermore, in this embodiment, a portion of or most of light dropped off the rotation mode and going to exit outwardly, is bent back to be coupled to the other rotation mode. The reflection surface 205 is a surface being perpendicular to the advancement direction of the reflection light (zero-th order diffraction light) of the corner mirror 206. As regards the advancement direction of the reflection light, there are two different directions corresponding to the clockwise rotation mode and the counterclockwise rotation mode, respectively. The reflection surface 205 is perpendicular only to one of them, and it reflects a portion of or most of the light and transmits it in an opposite direction.

It is seen from the drawing that reflection light in the counterclockwise direction is bent by the reflection surface 205 and, as the same is subsequently reflected by the corner mirror 206, the light is coupled to the clockwise rotation mode.

With this arrangement, the coefficient of coupling from light having a counterclockwise rotation mode to light having a clockwise rotation mode is enlarged and, thus, the coupling of these two rotation modes can be a strong coupling.

However, the coupling from the clockwise rotation mode to the counterclockwise rotation mode is small. In such a laser, the laser oscillation starts from the clockwise rotation mode, and, since the coupling of the two rotation modes is strong coupling, laser oscillation in the counterclockwise mode is suppressed.

As a result of this, formation of a standing wave in the resonator is avoided and, thus, variation of near-field intensity due to phase changes between the oscillation modes of the ring resonator type semiconductor laser is suppressed. Thus, a stable near-field light source is accomplished.

Furthermore, as in the first embodiment, a structure whereby surface plasmon polariton is excited upon the metal film 202 is possible. More specifically, it is such a structure that positive first order diffraction light of clockwise rotation mode light at the corner mirror 206 and negative second order diffraction light of counterclockwise rotation mode light serve to excite the surface plasmon polariton.

Figure 9:
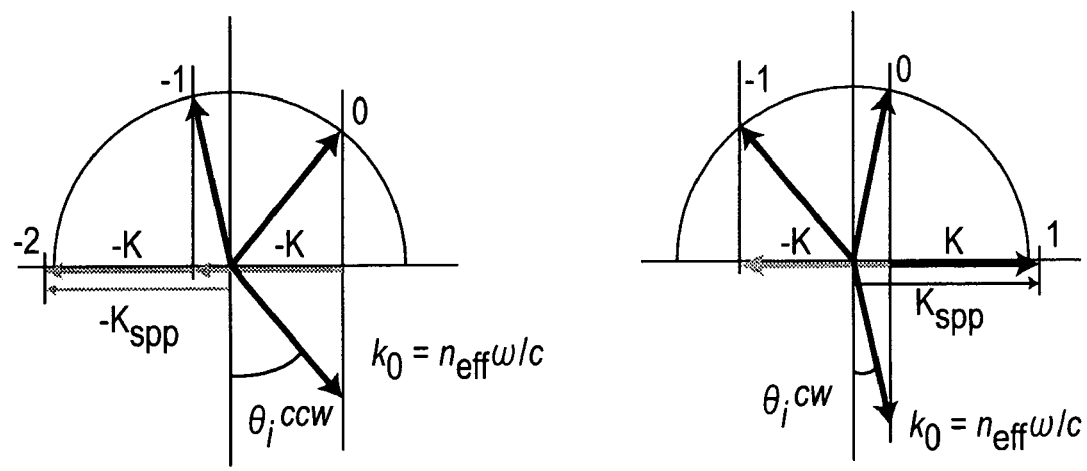
FIG. 9 is a schematic view for explaining a wave number vector of higher order diffraction light of a diffraction grating, in the second embodiment of the present invention.

If respective conditions are expressed by an equation (see FIG. 9), the condition for excitement of surface plasmon with respect to positive first order diffraction light of the clockwise rotation mode light is given by equation (5) below.

$$neff\frac{\omega}{c}\sin\theta i^{cw} + \frac{2\pi}{\Lambda} = Kspp \qquad (5)$$

On the other hand, the condition for excitement of surface plasmon with respect to negative second order diffraction light of the counterclockwise rotation mode light is given by equation (6) below.

$$neff\frac{\omega}{c}\sin\theta i^{ccw} - 2\frac{2\pi}{\Lambda} = -Kspp \qquad (6)$$

From these equations, equation (7) below can be derived.

$$2\sin\theta i^{cw} + \sin\theta i^{ccw} = Kssp\Big/\left(neff\frac{\omega}{c}\right) \geq 1 \qquad (7)$$

Embodiment 3

Figure 4:
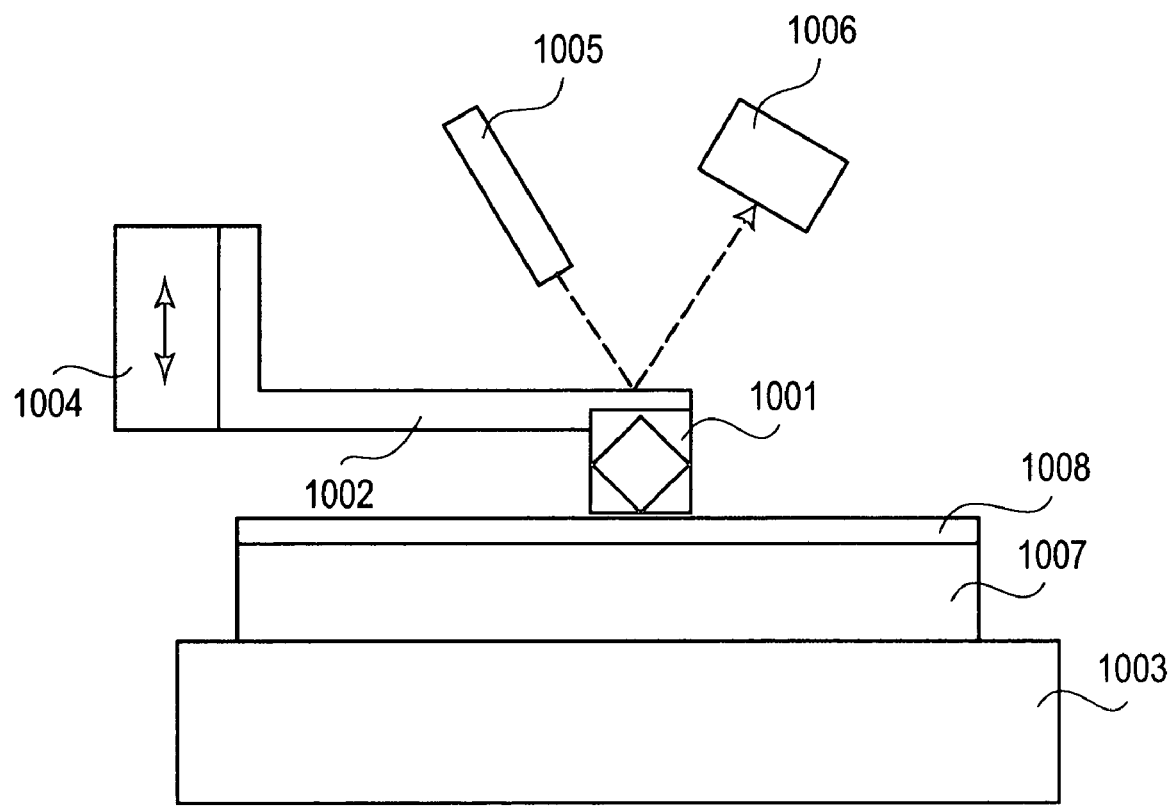
FIG. 4 is a schematic view of the structure of an exposure apparatus according to a third embodiment of the present invention.

FIG. 4 shows the structure of an exposure apparatus according to a third embodiment of the present invention.

Denoted in FIG. 4 at 1001 is a near-field light source of the present invention, and denoted at 1002 is a cantilever. Denoted at 1003 is a wafer stage, and denoted at 1004 is a piezoelectric device. Denoted at 1005 is a position detecting semiconductor laser, and denoted at 1006 is a half-split sensor. Denoted at 1007 is a wafer, and denoted at 1008 is a resist film on the wafer. The resist thin film 1008 being sensitive to near-field light around a small opening of the near-field light source is applied to the wafer 1007 surface. The near-field light source 1001 is mounted on the cantilever 1002, and by means of the piezoelectric device 1004, the distance from the wafer stage 1003 or from the resist film 1008 of the wafer surface mounted on the wafer stage can be controlled. Specifically, this distance can be controlled in accordance with the principle of an optical lever, such that laser light from the position detecting semiconductor laser 1005 is projected around the tip end of the cantilever 1002 and reflection light therefrom is received by the half-split sensor 1006.

In synchronism with the timing of a two-dimensional scan of the wafer stage 1003, carrying the wafer 1007 thereon, the drive current for the near-field light source 1001 is controlled to turn on and off the near-field light. A desired resist pattern can be formed by this.

Embodiment 4

Figure 5:
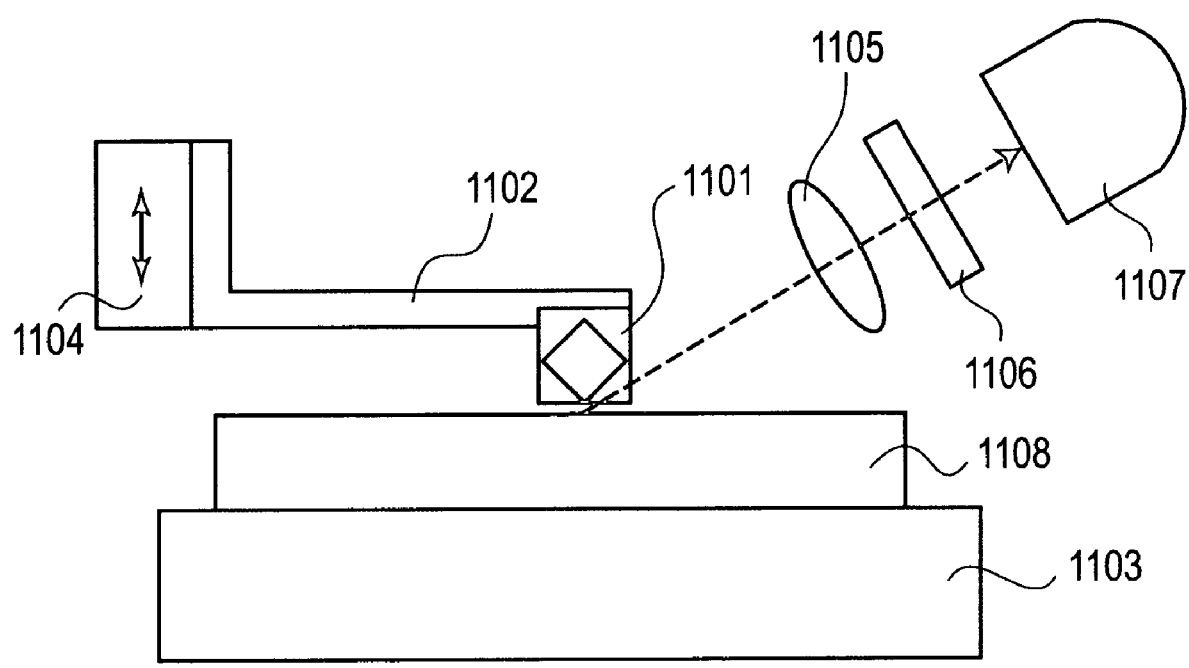
FIG. 5 is a schematic view of the structure of a microscope according to a fourth embodiment of the present invention.

FIG. 5 shows the structure of a microscope according to a fourth embodiment of the present invention.

Denoted at 1101 is a near-field light source of the present invention, and denoted at 1102 is a cantilever. Denoted at 1103 is a sample stage, and denoted at 1104 is a piezoelectric device. Denoted at 1105 is a lens, and denoted at 1106 is an interference filter. Denoted at 1107 is a photodetector, and denoted at 1108 is a sample.

Near-field light around a small opening of the near-field light source 1101 is projected to the sample from its front face side, and reflectively scattered light from the sample is collected by the lens 1105. The light is then detected by the photodetector 1107 through the interference filter 1106. This is just an SNOM of a reflection type oblique-direction photo-detecting structure. The near-field light source 1101 is mounted on the cantilever 1102 and, by means of the piezoelectric device 1104, the distance from the wafer stage 1103 or from the sample 1108 mounted thereon can be controlled.

Since the intensity of the optical near field leaking from the small opening reduces exponentially with the distance from the opening, it is necessary that the free end of the optical probe is closely approximated to the sample surface, to a distance of 100 nm or less, and then, control should be done to maintain a constant clearance. As regards the distance controlling method therefore, examples are: (1) a sheer force method in which an optical probe is minutely oscillated in a direction perpendicular to the direction of a normal to the sample surface and in which distance control is performed so as to keep, constant, the reduction of amplitude of oscillation due to the van der Waals force, in which the optical probe free end receives from the sample surface; and (2) an AFM method in which the optical probe is supported by an elastic member being elastically deformable in a direction of a normal to the sample surface, and in which the distance control is performed so as to keep, constant, the amount of elastic deformation of the elastic member due to the van der Waals force, which acts between the optical probe tip end and the sample surface. Anyway, while controlling the distance between the optical probe and the sample in the manner such as described above, the two-dimensional stage 1103 on which the sample 1108 is mounted is driven and two-dimensional scan thereof with respect to the near-field light source 1101 is carried out. The magnitude of signals from the photodetector 1107 at different positions during the two-dimensional scan is mapped, whereby an image of the sample surface by the near-field optical microscope is obtained.

Embodiment 5

In a fifth embodiment of the present invention, a near-field light source device is structured so that each of the clockwise rotation mode and the counterclockwise rotation mode provides surface plasmon polariton upon the surface of a light blocking film, on the basis of negative first (−1st) order light.

The structure of the near-field light source device and the manner of producing the same are similar to those of the first embodiment.

Figure 10:
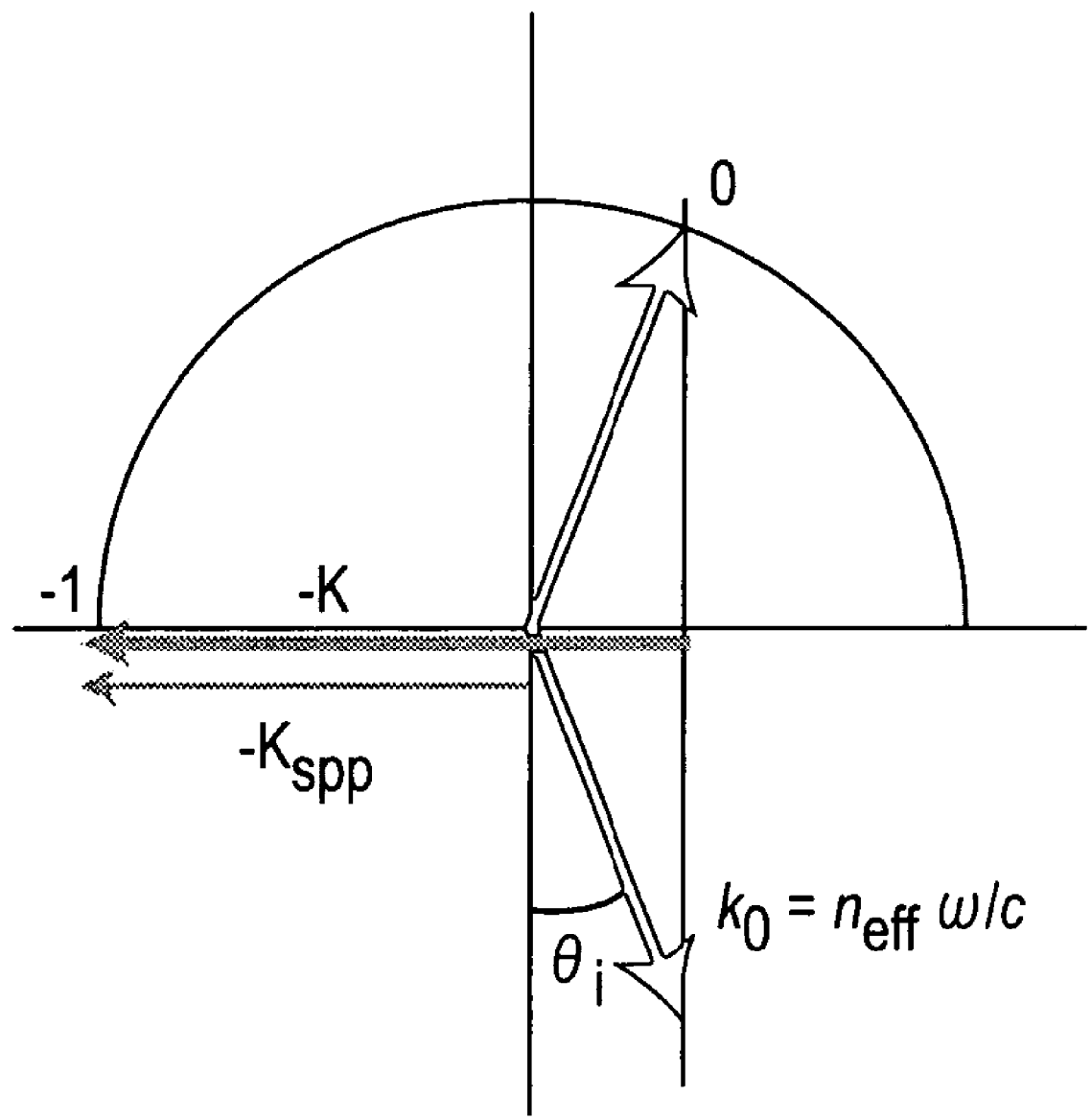
FIG. 10 is a schematic view for explaining a wave number vector of higher order diffraction light of a diffraction grating, in a fifth embodiment of the present invention.

The counterclockwise rotation mode with incidence at an incidence angle of θi serves to excite, through negative first order diffraction, a surface plasmon to be propagated leftwardly along the light blocking film surface. Also, the clockwise rotation mode serves to excite, through negative first order diffraction, a surface plasmon to be propagated rightwardly along the light blocking film surface. These two conditions are the same, and they can be expressed by equation (8) below. See FIG. 10.

$$neff \frac{\omega}{c} \sin\theta i - \frac{2\pi}{\Lambda} = -Kspp \quad (8)$$

As in the second embodiment, total resonator loss is determined by (a) the characteristics of the resonator longitudinal mode determined by the rotational distance of the resonator (i.e., characteristics of wavelengths such as N−1 wavelength, N wavelength, N+1 wavelength, and so on, when the rotation distance of the resonator is counted in terms of wavelength inside the medium) and (b) the wavelength dependent loss given by equation (8), and then, the laser oscillation wavelength is determined. Since the single longitudinal mode oscillation determined by the diffraction grating is held even if the injection current is enlarged from the threshold level, mode competition noise or mode hopping noise in the optical output, for example, can be well avoided and, thus, a stable near-field light source is accomplished.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-320925 filed Sep. 12, 2003, which is hereby incorporated by reference.

What is claimed is:

1. A near-field light source device, comprising:
   a semiconductor laser comprised of laminated semiconductor layers and having a ring-type optical resonator with a plurality of wave guides connected via mirror portions;
   a light blocking film formed in one of the mirror portions and having a small opening not greater than a wavelength size; and
   a diffraction grating formed on said light blocking film,
   wherein light oscillated from said semiconductor laser is diffracted by said diffraction grating, the diffracted light is coupled to a rotation mode in said ring-type optical resonator, and near-field light is generated via the small opening, and
   wherein a rotating direction in said ring-type optical resonator has two different and independent modes, in the two rotation modes, higher-order diffracted light in the diffracted light is coupled to a rotation mode of one of the same direction and an opposite direction.

2. A near-field light source device according to claim 1, wherein the small opening is a slit-like opening being elongated in a direction along a groove of a diffraction grating.

3. A near-field light source device according to claim 1, wherein said ring type optical resonator has a combination of straight wave guides.

4. A near-field light source device according to claim 1, wherein higher order diffraction light produced by said diffraction grating excites surface plasma polariton upon said light blocking film to reinforce the intensity of near-field light in the vicinity of the small opening.

5. A near-field light source device according to claim 4, wherein an electrical field vector of laser light produced by said semiconductor laser extends along a surface direction of a lamination structure and includes a component perpendicular to an interface, at said diffraction grating.

6. A floating type optical head comprising:
   a near-field light source device as recited in claim 1; and
   means for floating said near-field light source device at a surface of a recording medium so that at least one of recording, reproducing and erasing are carried out on the basis of light produced in the vicinity of the opening.

7. An optical device, comprising:
   a near-field light source device as recited in claim 1; and
   means for performing at least one of recording, reproducing and erasing by use of said near-field light source device.

8. An exposure apparatus, comprising:
   a near-field light source device as recited in claim 1; and
   a wafer stage,
   wherein said near-field light source device is disposed close to said wafer stage, and exposure is carried out on the basis of light produced in the vicinity of the opening.

9. A microscope, comprising:
a near-field light source device as recited in claim 1; and
a sample table,
wherein said near-field light source device is disposed close to said sample table, and observation of a sample is carried out on the basis of light produced in the vicinity of the opening and projected to the sample.

\* \* \* \* \*

UNITED STATES PATENT AND TRADEMARK OFFICE
CERTIFICATE OF CORRECTION

PATENT NO. : 7,280,578 B2 Page 1 of 1
APPLICATION NO. : 10/937387
DATED : October 9, 2007
INVENTOR(S) : Natsuhiko Mizutani et al.

It is certified that error appears in the above-identified patent and that said Letters Patent is hereby corrected as shown below:

COLUMN 3:
Line 28, "device" should read -- device, --.

COLUMN 4:
Line 12, "oscillation" should read -- oscillated --.

COLUMN 5:
Line 67, "plamson" should read -- plasmon --.

COLUMN 7:
Line 42, "layer 112," should read -- layer 113, --.

COLUMN 8:
Line 1, "on" should read -- of --.
Line 39, "0.85 μn" should read -- 0.85 μm --.

COLUMN 10:
Line 20, "small" should read -- with a small --.

COLUMN 13:
Line 8, "sheer" should read -- shear --.
Line 11, "keep, constant," should read -- keep constant --.
Line 12, "in" should be deleted.
Line 17, "keep," should read -- keep --.
Line 18, "constant," should read -- constant --.

Signed and Sealed this

Thirteenth Day of May, 2008

JON W. DUDAS
*Director of the United States Patent and Trademark Office*